United States Patent [19]

Nakagawa

[11] Patent Number: 5,558,487

[45] Date of Patent: Sep. 24, 1996

[54] TRANSPORTING SYSTEM FOR AN ARTICLE

[75] Inventor: Kiyoshi Nakagawa, Kanagawa, Japan

[73] Assignee: Sony Corporation, Japan

[21] Appl. No.: 371,202

[22] Filed: Jan. 11, 1995

[30] Foreign Application Priority Data

Jan. 25, 1994 [JP] Japan .................................. 6-023104

[51] Int. Cl.$^6$ .................................................. B65G 65/00
[52] U.S. Cl. ........................... 414/744.6; 74/98; 74/110; 74/490.01; 414/917; 414/937; 901/17
[58] Field of Search .............................. 414/744.1, 744.6, 414/749, 917, 935, 937, 939, 718, 728; 74/98, 110, 490.01; 901/15, 17, 21; 187/211, 269

[56] References Cited

U.S. PATENT DOCUMENTS

| | | | |
|---|---|---|---|
| 4,405,116 | 9/1983 | Eisenberg | 187/269 |
| 4,674,948 | 6/1987 | Hornacek | 901/17 |
| 4,909,701 | 3/1990 | Hardegen et al. | 414/744.6 |
| 4,951,601 | 8/1990 | Maydan et al. | 414/939 |

FOREIGN PATENT DOCUMENTS

| | | | |
|---|---|---|---|
| 1514606 | 10/1989 | U.S.S.R. | 414/744.6 |
| 4014185 | 6/1994 | WIPO | 414/939 |

*Primary Examiner*—Karen B. Merritt
*Assistant Examiner*—Gregory A. Morse
*Attorney, Agent, or Firm*—Ronald P. Kananen

[57] ABSTRACT

In an article transporting system, a first linear moving arm and a second linear moving arm are juxtaposed to each other so as to be moved linearly while keeping a parallel positional relationship with each other. First end portions of the linear moving arms are coupled to an article transporting unit through first and second links. A linear drive mechanism is provided for linearly moving the article transporting unit in a direction perpendicular to the moving direction of the linear moving arms by the linear movement of the first and second linear moving arms. The first and second linear moving arms are synchronously linearly moved in opposite directions to each other. In this case, to avoid an unstable posture of the article transporting unit during the movement, a posture maintaining device is provided between one of the first and second linear moving arms and the article transporting unit. It is possible to save a space for the article transporting work by using the two linear moving arms and the link mechanism.

11 Claims, 18 Drawing Sheets

TRANSPORTING SYSTEM FOR AN ARTICLE

BACKGROUND OF THE INVENTION

The present invention relates to a novel transporting system for an article. More particularly, it relates to a novel transporting system for an article in which two linear arms and ink mechanism are used to thereby save space for article transporting operations.

Various robotic systems are used to transport an article from one place to another in a manufacturing process or the like.

For instance, a scalar type robot shown in FIG. 18A and a so-called frog leg type handler shown in FIG. 18B are used to transport planar components such as hard discs or semiconductor wafers.

FIG. 18A is a plan view showing the work to transport a disc c held within a work box b to another work box d by a scalar type robot a.

The scalar robot a includes a proximal shaft portion e, a first arm f pivotally provided about the proximal shaft portion e and a second arm g pivotally provided relative to the first arm f. A disc c may be laid on a hand h mounted on a hand portion of the second arm g.

A plurality of discs c are received in the work box b which is the origin for transportation, The work box b and the work box d which are the destination for transportation are arranged at an angular interval of 90° about the proximal shaft portion e of the scalar type robot a.

In the scalar robot a, after a Specified disc c has been picked up and laid on the hand h from the work box b as indicated by the solid lines in FIG. 18A, under the condition that the first arm f and the second arm g are collapsed, the first arm f is rotated about the proximal shaft portion e up to a stand-by position shown by the two-dotted and dash lines in FIG. 18A. Then, the angle defined by the first arm f and the second arm g is increased so that the hand h is located within the work box d to thereby receive the disc c held on the hand h into the work box d.

FIG. 18B is a plan view showing the work where the disc c held within the work box b is to be transported to the interior of the work box d by the frog leg type handler i.

The frog leg type handle i is provided with two pairs of arm units j and k composed of inner and outer arms connected at their end to each other and having the same effective length. The inner arms lj and lk of the respective arm units j and k are pivotally mounted at first end portions on a proximal shaft portion m, and first end portion of the outer arm nj and nk are pivotally mounted on the other ends of the inner arms lj and lk. The other end portions of the outer arms nj and nk are pivotally mounted on the hand o.

As shown by the solid lines in FIG. 18B, when a specified disc c is laid on and picked up from the work box b, since the two inner arms lj and lk are rotated with a Space between their tip ends being expanded, the tip end portions of the outer arms nj and nk are drawn toward the proximal shaft portion m. Namely, the hand o is moved along a straight line that passes through the midpoint between the tip end portions of the outer arms nj and nk and the center of the proximal shaft portion m.

Thereafter, when the arm units j and k are rotated up to the stand-by position indicated by the two-dotted and dash lines in FIG. 18B and the two inner arms lj and lk are rotated with their end portions being closed by the rotation of the proximal shaft portion m the tip end portions of the outer arms nj and jk are moved in a direction away from the proximal shaft portion m. Then, the hand o is moved into the work box d and delivering the disc c into the work box d.

However, in either case of the above-described systems as viewed from above (in plan view), a large dead space caused by the bending of the arms occurs and largely restricts the arrangement of peripheral equipment necessary for assisting the work and therefore leads to an enlargement of the system as a whole.

More specifically, in the scalar type robot a as shown in FIG. 18A, an amount W of expansion caused by the bending operation of the first arm f and the second arm g (where W is based upon a reference line which passes through the center of rotation of he first arm f and the Center of rotation of the hand h) is generated. Thus, it is necessary to arrange the peripheral equipment in a place where there is no interference between the bending portion of the arms and the peripheral equipment.

Also, in the frog leg type handle i, as shown in FIG. 1 8B, expansion amounts Wj and Wk are generated by the arm units j and k, respectively, and the restriction to peripheral equipment is further increased.

SUMMARY OF THE INVENTION

Accordingly, according to the present invention, there is provided an article transporting apparatus comprising: a first linear moving arm and a second linear moving arm which are juxtaposed so as to move linearly with center axes of the first and second linear moving arms, keeping a substantially parallel relationship with each other; an article transporting unit for moving an article; a first link pivotally mounted at one end on a first end portion of the first linear moving arm and at the other end on the article transporting unit; a second link pivotally mounted at one end on a first end portion of the second linear moving means and at the other end with the article transporting unit; a linear drive means for moving the first and second linear moving arms synchronously with each other and opposite to each other so as to move the article transporting unit in a direction perpendicular to center axes of the first and second linear moving arms through a link mechanism composed of the first and second links; and a posture maintaining means interposed between the first and second linear moving arms so as not to change a posture of the article transporting unit during the movement of the article transporting unit.

In the article transporting mechanism according to the present invention, it is possible to change the angle defined between the first and second links and to move the article transporting unit in the direction perpendicular to the moving direction of the linear moving arms by linearly moving the two linear moving arms in the opposite directions. Accordingly, in moving the article, the angle defined by the first and second links which are arranged to open is increased to thereby minimize the extrusion amount of the collapsing motion of both links. Thus, it is possible to save the dead space and to make the system compact.

DESCRIPTION OF THE PREFERRED EMBODIMENTS

A transporting system for an article will now be described with reference to the accompanying drawings.

Prior to explaining the detailed structure of the transporting system for an article, the basic structure will first be described.

Figure 1:
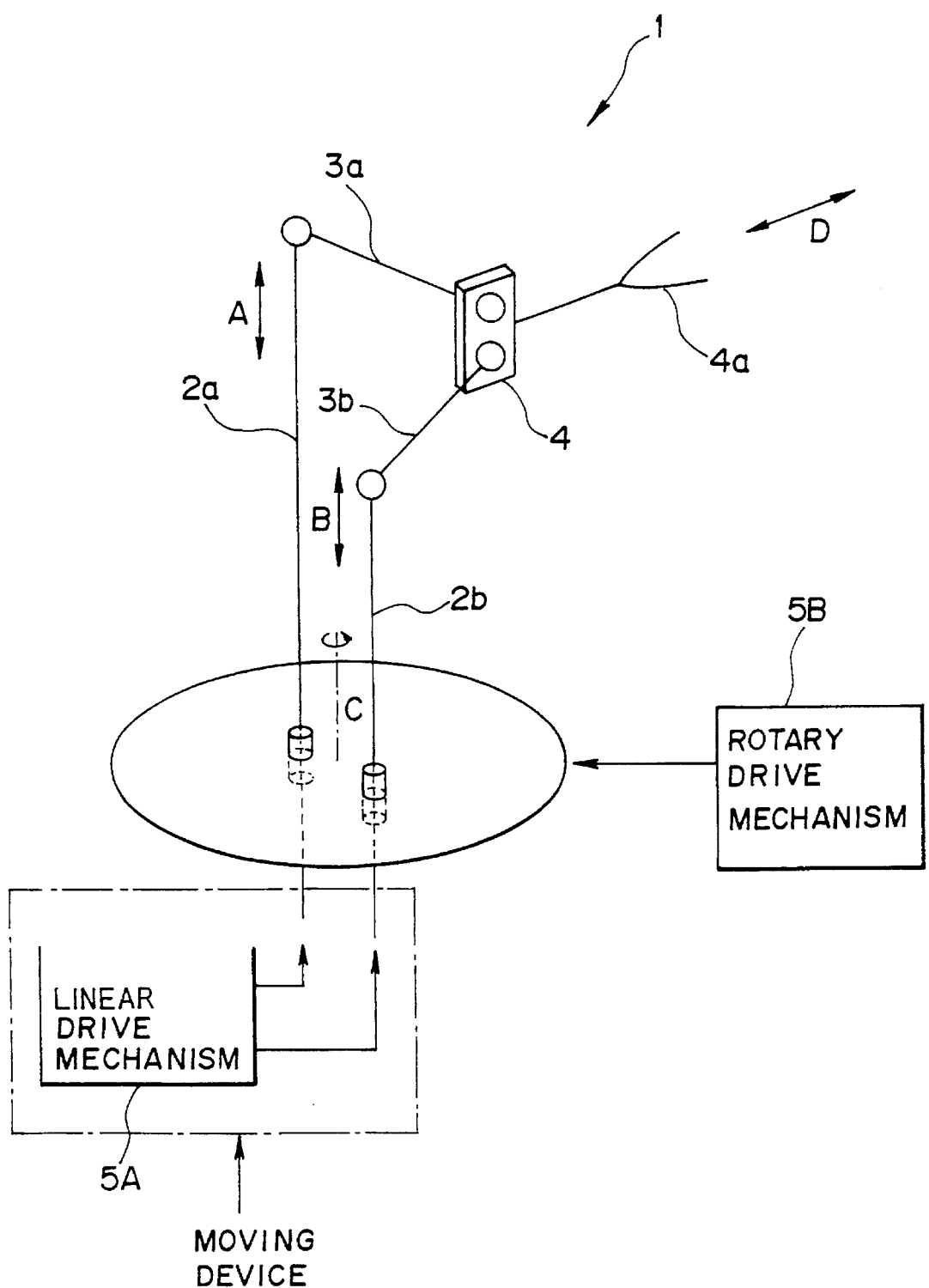
FIG. 1 is a schematic view showing a basic structure of an article transporting mechanism according to the present invention.

FIG. 1 is a schematic view showing the structure of the transporting system for an article.

A first linear moving arm 2a is linearly moved along a direction indicated by an arrow A in FIG. 1.

A second linear moving arm 2b is provided in parallel with the first linear moving arm 2a and is linearly moved in a direction in parallel with the moving direction of the first linear moving arm 2a as indicated by an arrow B.

A first link 3a is pivotally mounted at one end portion on one end portion of the first linear moving arm 2a with the other end pivotally mounted on an article transporting unit 4.

An end effector 4a such as a hand or the like is mounted on the article transporting unit 4 for laying thereon or gripping the article to be transported, A second link 3b is pivotally mounted at one end portion on one end portion of the second linear moving arm 2b with the other end pivotally mounted on an article transporting unit 4.

A linear drive mechanism 5A is provided for synchronously moving the first linear moving arm 2a and the second linear moving arm 2b in opposite directions to each other. Incidentally, if a moving device for moving the linear drive mechanism 5A is provided, it is possible to move the first and second linear moving arms and the linear drive mechanism 5A together in parallel to the moving direction of the linear moving arms.

A rotary drive mechanism 5B is provided for rotating the entire unit including the first and second linear moving arms and the linear drive mechanism 5A. A rotary axis C is defined by a straight line which is located within a plane including the center axis of the first linear moving arm 2a and the center axis of the second linear moving arm 2b and located in the mid point between both the center axes and in parallel with the center axes.

Then, in the article transporting system 1, when the first linear moving arm 2a and the second linear moving arm 2b are moved in the opposite directions by the linear drive mechanism 5a, an angle defined between the first link 3a and the second link 3b is changed, whereby as shown by an arrow D in FIG. 1, the article transporting unit 4 is moved in a direction perpendicular to the moving direction of the first and second linear moving arms. Incidentally, with only with two links, it is impossible to maintain the posture of the article transporting unit 4 during the movement, and some form of posture maintaining means is necessary.

Figure 2:
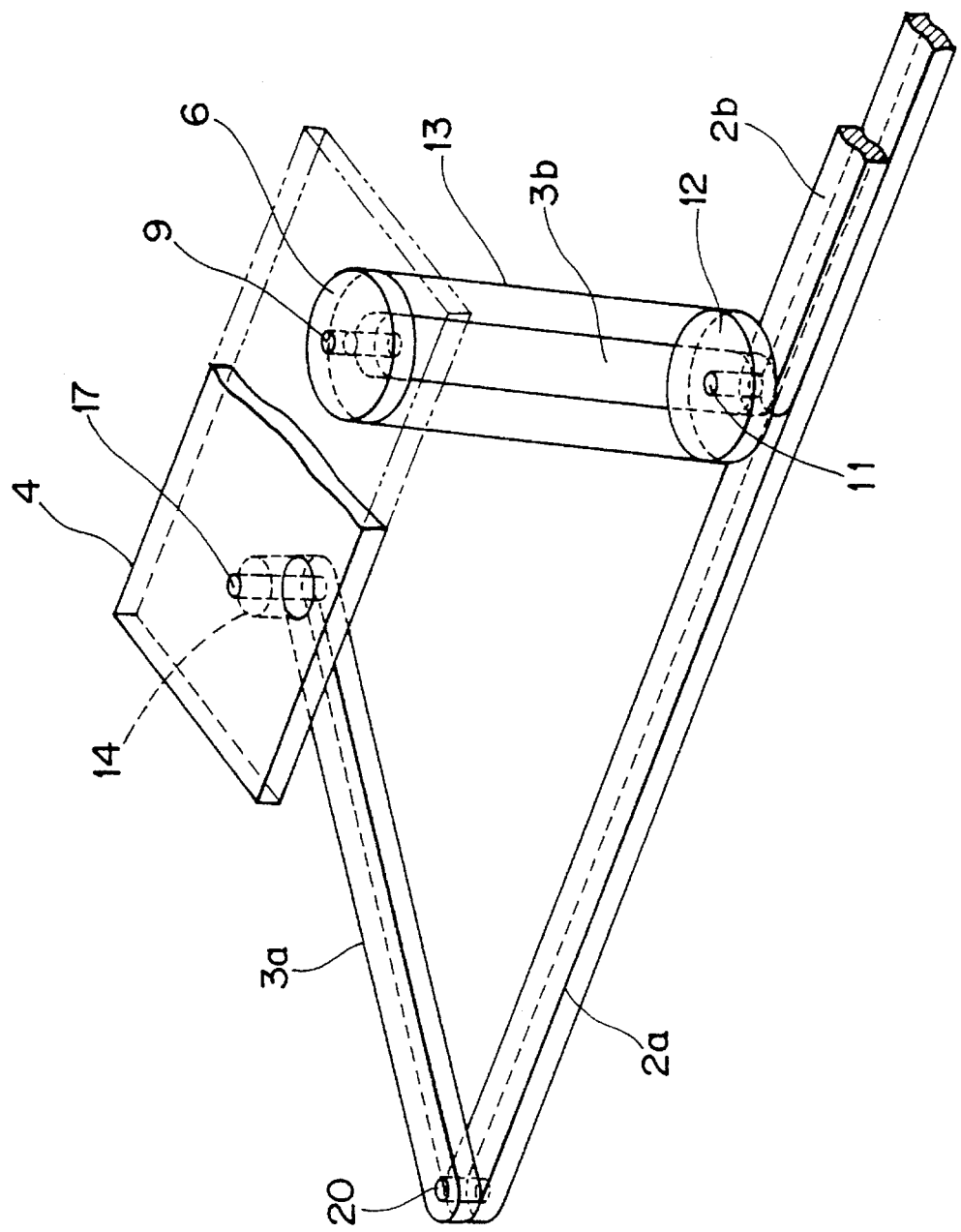
FIG. 2 is a perspective view showing an example in which pulleys and a timing belt are used as a posture maintaining means.
Figure 3:
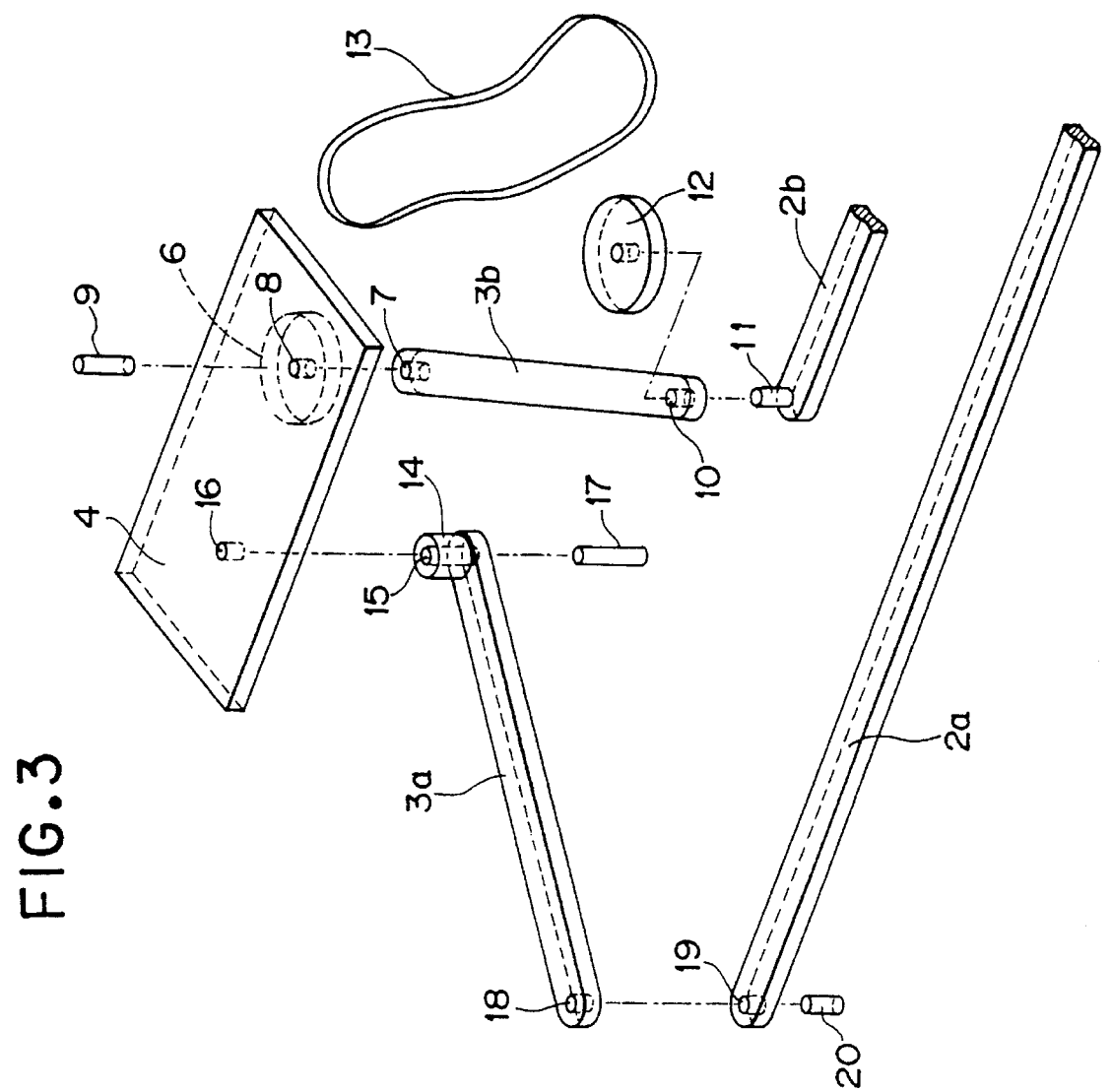
FIG. 3 is an exploded perspective view showing the posture maintaining means.

FIGS. 2 and 3 are schematic view showing an example of a posture maintaining means using a pair of timing pulleys and timing belts.

The article transporting unit 4 is in the form of a planar shape and a timing pulley 6 is fixed to one side face thereof.

The second link 3b is provided at one end with a through-hole 7. A pin 9 is inserted through the through-hole 7 into a through-hole 8 formed through the timing pulley 6. Thus, the second link 3b is mounted so as to be rotatable relative to the article transporting unit 4.

A shaft 11 formed in an upright state on an end portion of the second linear arm 2b passes through a through-hole 10 formed at the other end portion of the second link 3b. Thus, the second link 3b is rotatably mounted on the linear arm 2b.

A timing pulley 12 is fixed to a shaft 11. A timing belt 13 is laid between the timing pulley 12 and the above-described timing pulley 6.

A boss portion 14 is formed at one end portion of the first link 3a. A pin 17 is adapted to pass through a through-hole 15 formed in the boss portion 14 and a through-hole 16 formed in the article transporting unit 4. Thus, the first link 3a is rotatably mounted on the article transporting unit 4. A through-hole 18 is formed at the other end portion of the first link 3a and a through-hole 19 is formed at an end portion of the first linear moving arm 2a. A pin 20 is adapted to pass through these through-holes 18 and 19. Thus, the first link 3a is rotatably mounted on the first linear moving arm 2a.

Although not shown in the drawings, pull-out separation preventing means for the pins 9, 17 and 20 may be effected by fitting the ends of the pins or by using fastening pins or the like. Engaging means such as teeth are formed on the timing pulleys 6 and 12 and the timing belt 13.

Thus, in the case where the first linear moving arm 2a and the second linear moving arm 2b are moved in the opposite directions to each other through the same distance, the angle defined by the first link 3a and the second link 3b is changed so that the article transporting unit 4 is linearly moved in a direction perpendicular to the moving direction of the linear moving arms 2a and 2b. It is however noted that the posture of the article transporting unit 4 is restricted so that the straight line that passes through the respective centers of the pins 9 and 17 is always kept in parallel to each other by the effect of the timing belt 13. Namely, in the case where only the second linear moving arm 2b is kept in the stationary condition and the second link 3b is rotated about the shaft 11 in the direction in which the angle defined between the second link 3b and the second linear moving arm 2b is decreased, if the timing belt 13 is not provided in the system, the article transporting unit 4 changes its posture relative to the second linear moving arm 2b, the straight lines that passes through the respective centers of the pins 9 and the pin 17 is slanted relative to the second linear moving arm 2b. However, the timing belt 13 is moved in accordance with the rotation of the second link 3b, so that a force to return the article transporting unit 4 back toward the center axis of the second linear moving arm 2b and the posture of the article transporting unit 4 is corrected so as to be always kept in parallel with the center axis of the second linear moving arm 2b.

Figure 4:
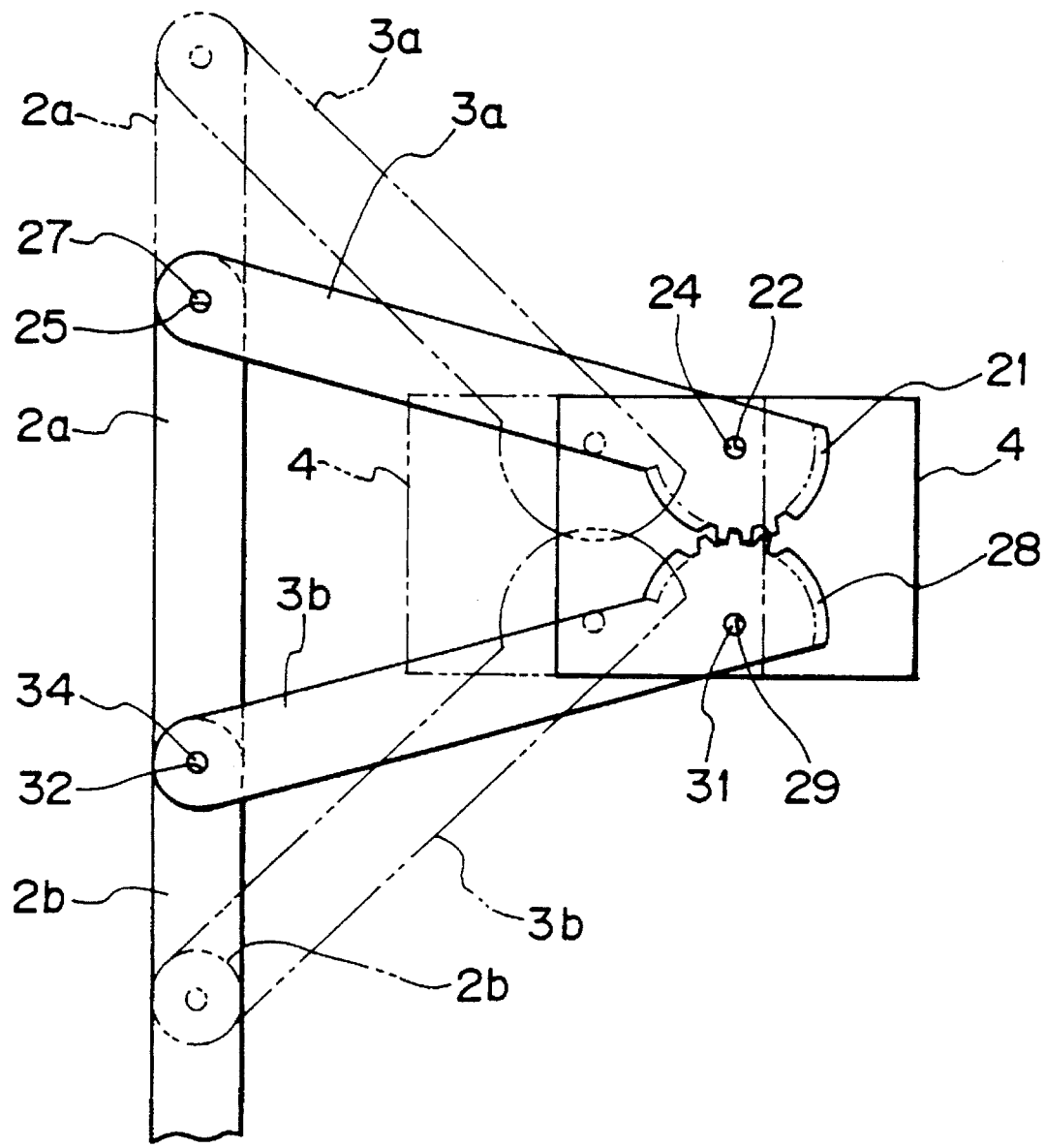
FIG. 4 is a side elevational view showing an example in which sector gears are used as the posture maintaining means.
Figure 5:
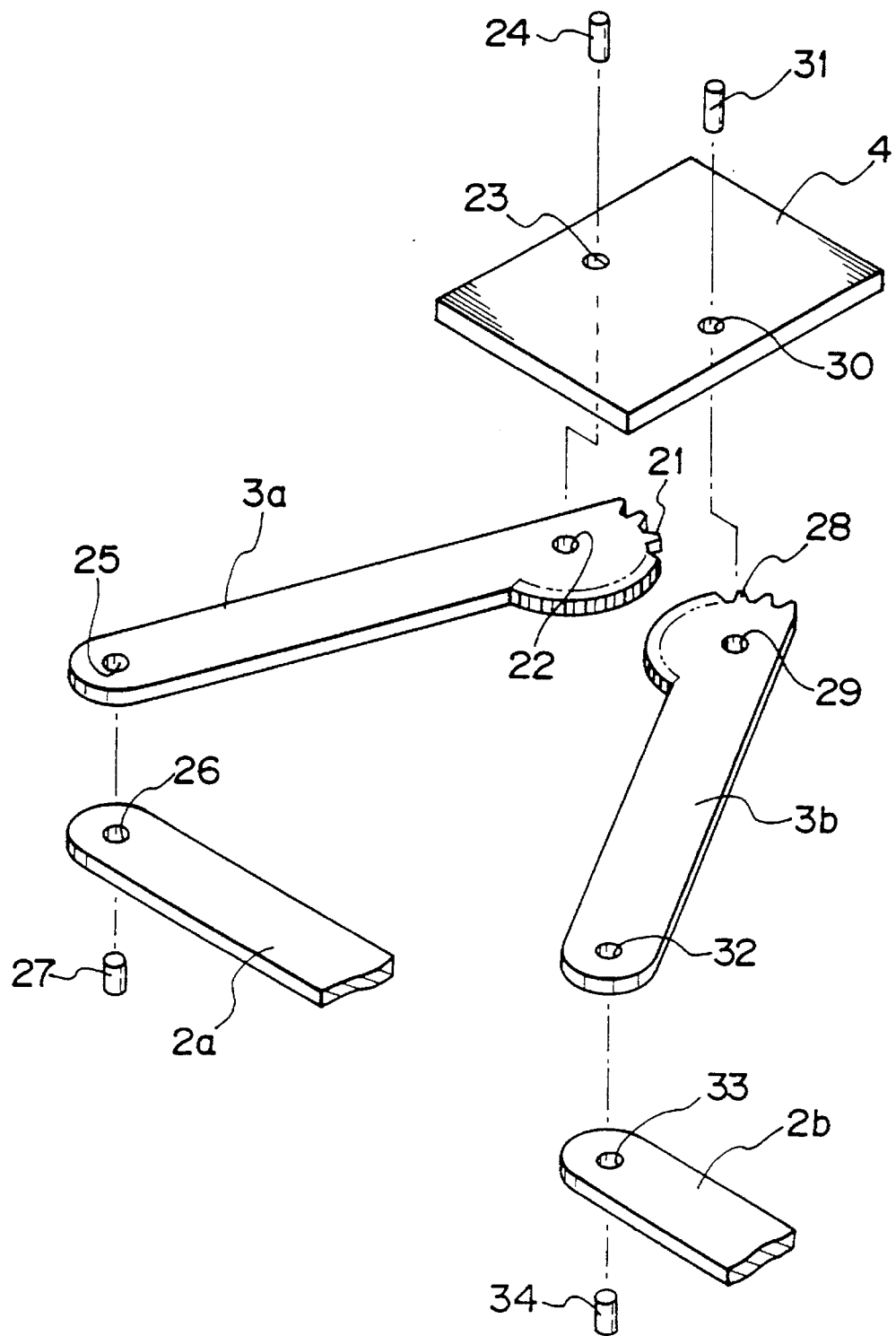
FIG. 5 is an exploded perspective view showing the posture maintaining means shown in FIG. 4.
Figure 6:
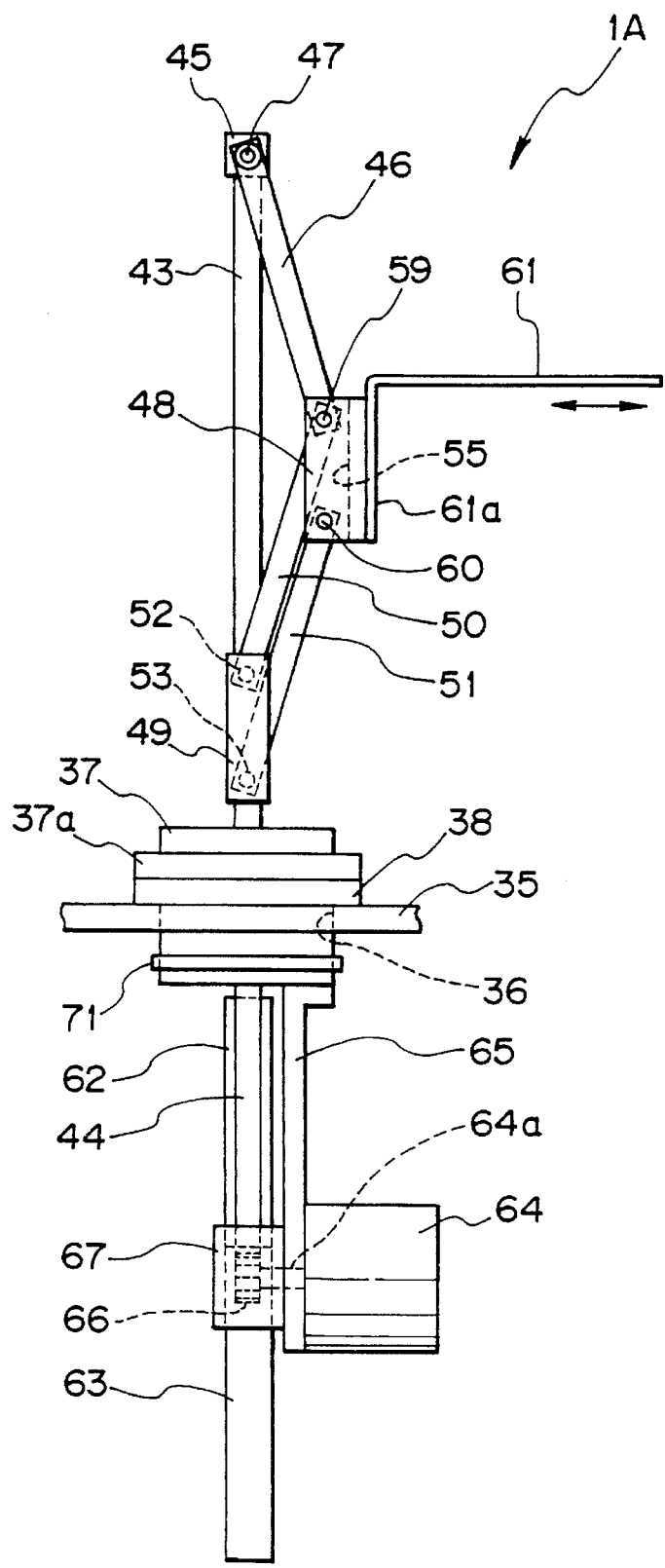
FIG. 6 is a side elevational view showing an example in which a parallel link mechanism is used as the posture maintaining means together with FIGS. 7 through 11.

FIGS. 4 and 5 are schematic views showing an example of the posture maintaining means which uses sector gears.

A sector gear 21 is formed at one end of the first link 3a. A through-hole 22 is formed in a central portion of the sector gear 21. A pin 24 is adapted to pass through a through-hole 23 formed in the article transporting unit 4 and the through-hole 22. Thus, the first link 3a is rotatably mounted on the article transporting unit 4.

Also, a through-hole 25 is formed at the other end portion of the first link 3a. A pin 27 is adapted to pass through the through-hole 25 and a through-hole 26 formed at an end portion of the first linear moving arm 2a. Thus, the first link 3a is rotatably mounted on the first linear moving arm 2a.

A sector gear 28 that engages with the sector gear 21 is formed at one end portion of the second link 3b. A through-hole 29 is formed in a central portion of the sector gear 28. A pin 31 is adapted to pass through a through-hole 30 formed in the article transporting unit 4 and the through-hole 29. Thus, the first link 3a is rotatably mounted on the article transporting unit 4.

Also, a through-hole 32 is formed at the other end portion of the second link 3b. A pin 34 is adapted to pass through the through-hole 32 and a through-hole 33 formed at an end portion of the second linear moving arm 2b. Thus, the second link 3b is rotatably mounted on the second linear moving arm 2b.

Although not shown in the drawings, pull-out separation preventing means for the pins 24, 27, 31 and 34 may be effected by fitting the ends of the pins or by using fastening pins or the like.

Thus, in the case where the first linear moving arm 2a and the second linear moving arm 2b are moved in the opposite directions to each other through the same distance, the angle defined by the first link 3a and the second link 3b is changed so that the article transporting unit 4 is linearly moved in a direction perpendicular to the moving direction of the linear moving arms 2a and 2b. It is however noted that the posture of the article transporting unit 4 is restricted so that the straight line that passes through the respective centers of the pins 24 and 31 is always kept in parallel to each other by the engagement of the sector gears 21 and 28.

In the foregoing examples, the end portions of the first link 3a and the second link 3b are rotatably mounted on the article transporting unit 4 by the discrete pins. However, in an embodiment shown in FIGS. 6 through 11, the end portion of the first link 3a and the end portion of the second link 3b are rotatably mounted on the article transporting unit 4 by a single pin, and at the same time, a third link is provided relative to the first link 3a or the second link 3b to form a parallelepiped link mechanism for the posture maintaining means.

Figure 7:
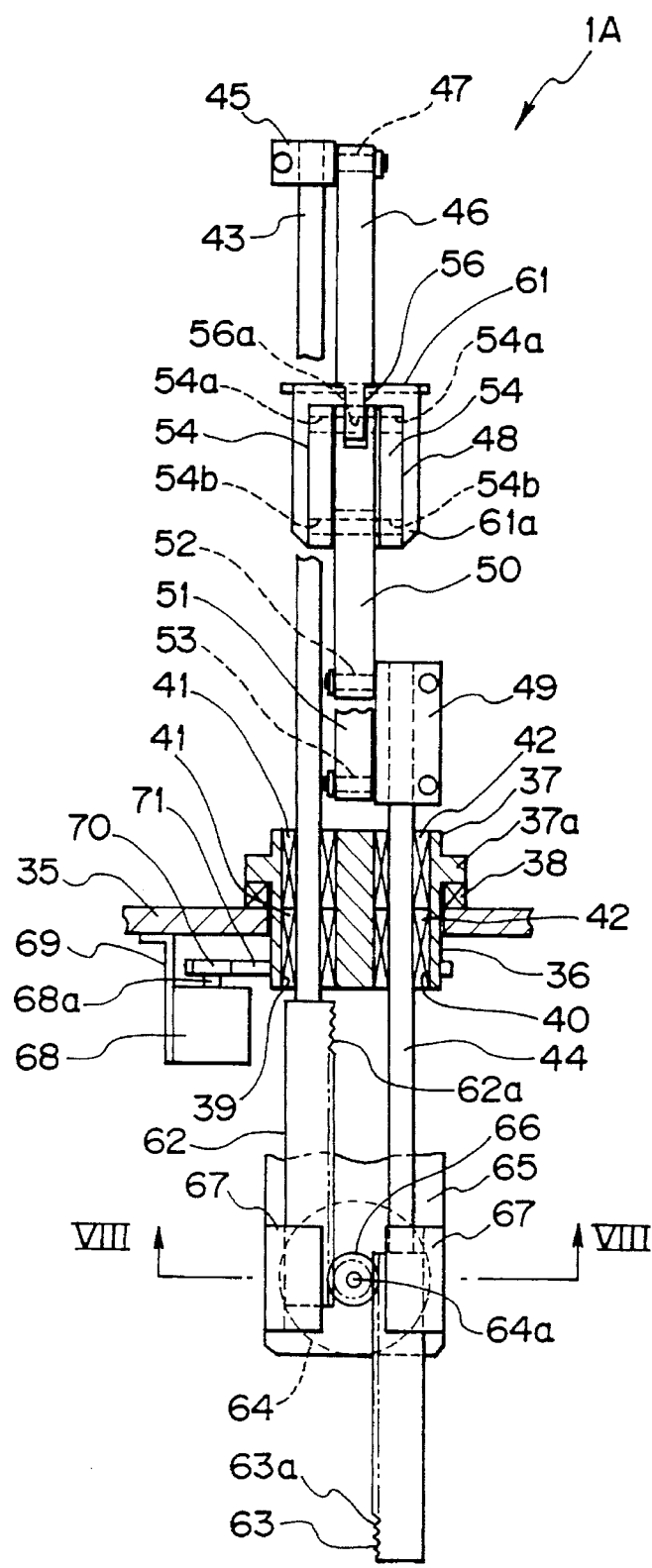
FIG. 7 is a side elevational, partially fragmentary view as viewed from a different direction from that of FIG. 6.
Figure 8:
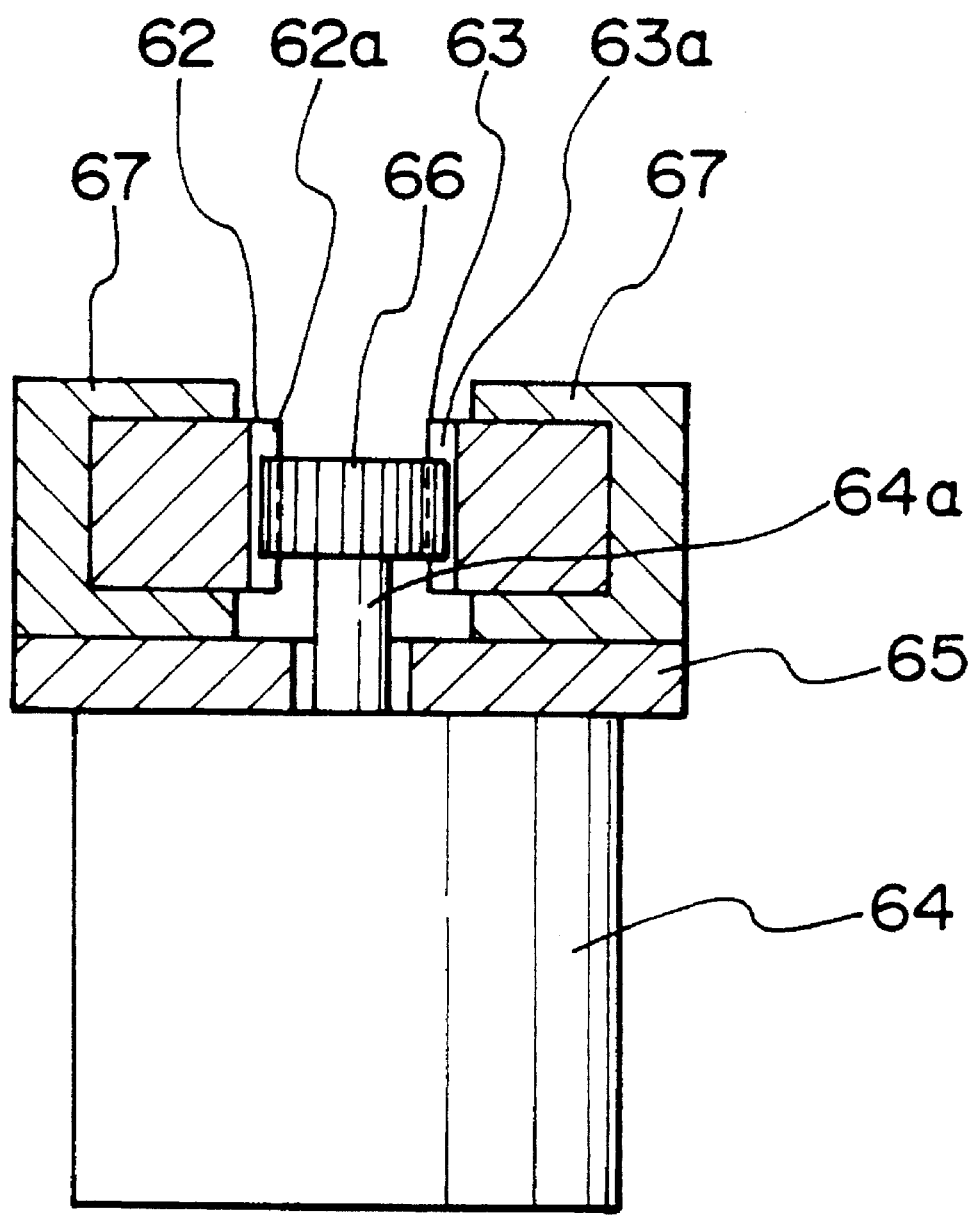
FIG. 8 is an enlarged cross-sectional view taken along the line VIII—VIII of FIG. 7.
Figure 9:
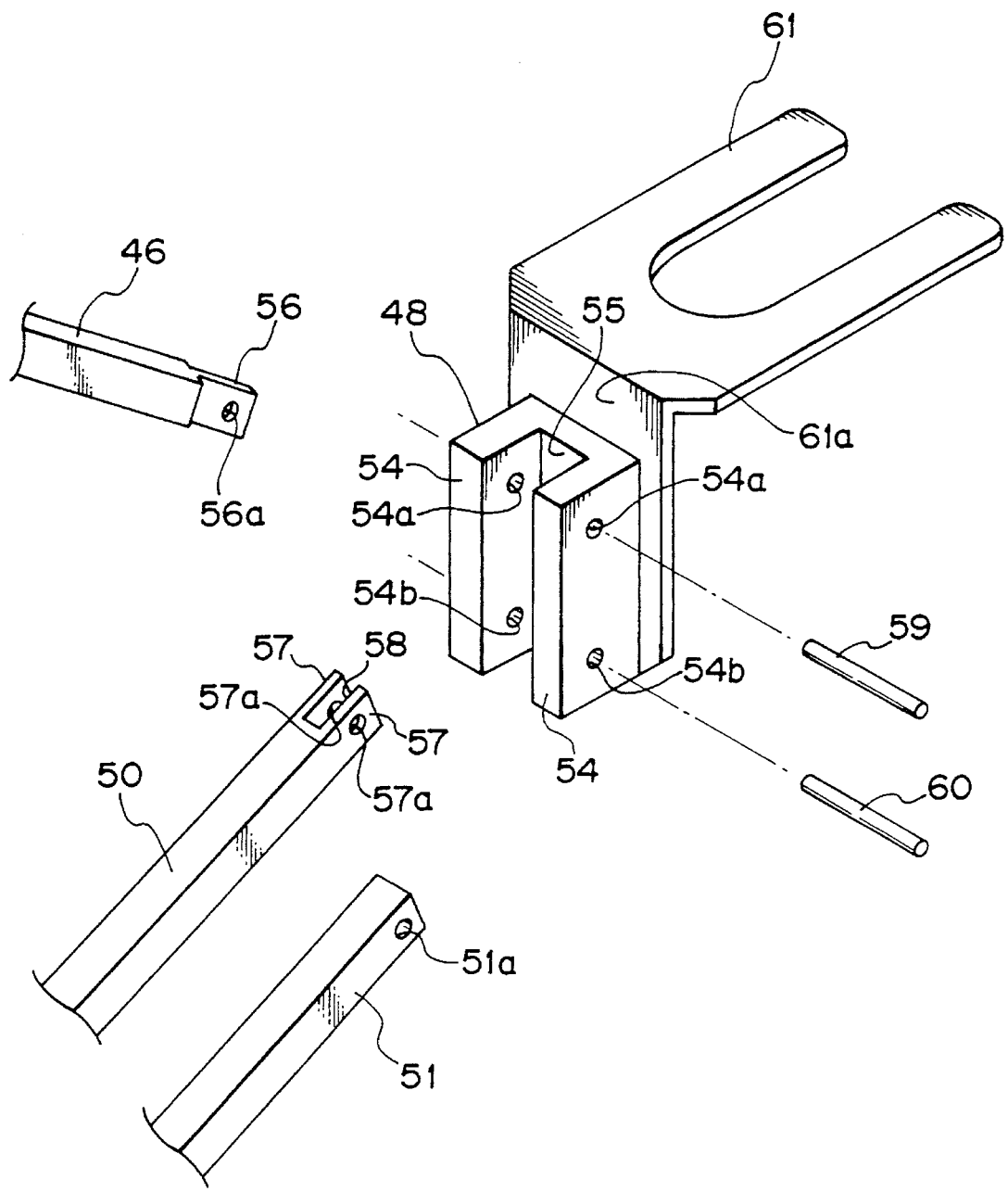
FIG. 9 is a perspective view showing a primary part of mounting links onto the link mount portion of the article transporting unit.

A circular hole 36 is formed in a base 35. A lower half portion of a bearing holder having a substantially cylindrical shape is received in the circular hole 36. A flange 37a formed on the upper side is laid on the base 35 through a bearing 38. Thus, the bearing holder 37 is rotatably supported to the base 35 so as to be rotatable about its center axis. As shown in FIG. 7, two through-holes 39 and 40 each extending vertically are formed at an interval in the bearing holder 37. Bearings 41, 41 are received in the through-hole 39 and bearings 42, 42 are received in the through-hole 40.

One 43 of round rods 43 and 44 forms the first linear moving arm 2a, and the other 44 forms the second linear moving arm 2b. The rod 43 is slidably supported to the bearing holder 37 through the bearings 41, 41. Also, the rod 44 is supported to the bearing holder 37 through the bearings 42, 42 so as to be slidable vertically.

A link mount portion 45 is provided at an end portion of the rod 43. One end portion of a link 46 is rotatably mounted on the link mount portion 45 by a pin 47. The link 46 corresponds to the above-described first link 3a, and the other end thereof is rotatably mounted on a link mount portion 48 of the article transporting unit.

A link mount portion 49 is provided at the upper end portion of the rod 44, and first end portions of the two links 50 and 51 are mounted on the link mount portion 49 by pins 52 and 53, respectively. One of the links 50 corresponds to the second link 3b, and the other link 51 is used to form the parallelepiped link mechanism together with the link 50. The other end portions of the links 50 and 51 are rotatably mounted on the link mount portion 48.

Two projection members 54, 54 (see FIG. 9) each extending vertically to have a U-shaped cross-section in a horizontal direction are formed on the link mount portion 48. A cut recess 55 is formed between the projection members 54, 54. Then, the end portions of the links 46, 50 and 51 are received in the cut recess 55 and are mounted on the projection members 54, 54 by pins. Incidentally, insertion holes 54a and 54b each extending in the horizontal direction are formed at a predetermined interval in the projection members 54 so that the insertion holes 54a are located on the upper side and the insertion holes 54b are located on the lower side.

A projected portion 56 is formed at an end of the link 46 and an insertion hole 56a extending in the horizontal direction is formed in the projected portion 56.

A pair of projected pieces 57, 57 are formed at the end of the link 50 and a recess 58 is formed between the projected pieces 57, 57 corresponding to the projected portion 56. Incidentally, insertion holes 57a, 57a are formed in the projected pieces 57, 57.

When the links 46 and 50 are to be mounted on the link mount portion 48, keeping the projected portion 56 of the link 46 to be engaged with the recess 58 of the link 50, these components are located within the cut recess 55 of the link mount portion 48, and thereafter, the insertion holes 56*a*, 57*a* and 54*a* are positioned exactly. Then, a pin 59 is caused to pass through the holes. Thus, the end portions of the links 46 and 50 are rotatably mounted on the link mount portion 48 using the same pin 59 as a pivot shaft.

An insertion hole 51*a* is formed at the end portion of the link 51. When the link 51 is to be mounted on the link mount portion 48, the end of the link 51 is positioned within the cut recess 55 of the link mount portion 48, and thereafter, the insertion holes 51*a* and 54*b* are positioned exactly. Then, a pin 60 is caused to pass through these holes. Thus, the end portion of the link 51 is rotatably mounted on the link mount portion 48 by using the pin 60 as a pivot shaft. It should be noted that a distance between the pin 60 and the pin 89 is equal to that of the pins 52 in the link mount portion 49.

Figure 10:
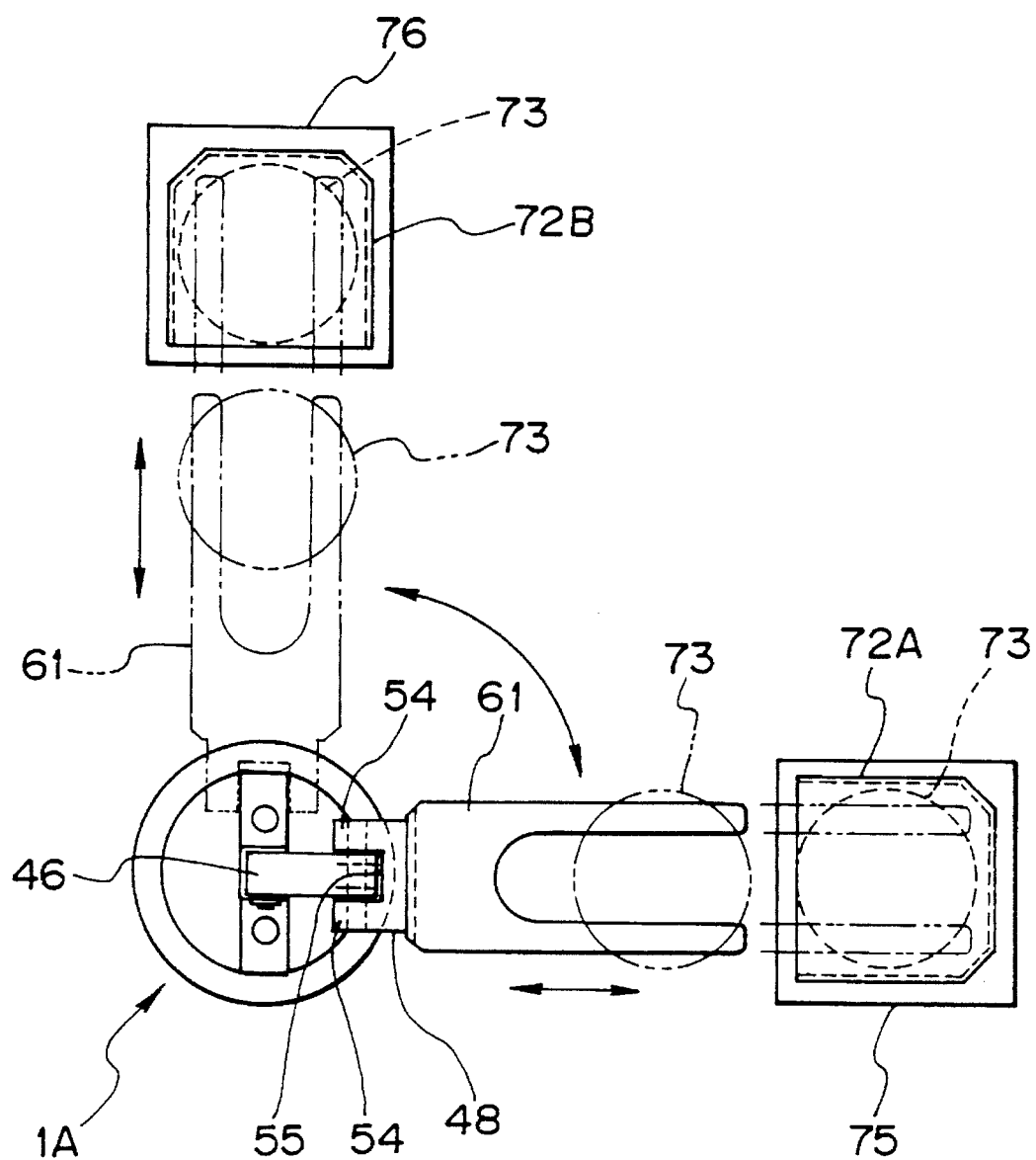
FIG. 10 is a plan view showing a state of the disc transporting work.

An article tray member 61 to be used as a hand is fixed to the link mount portion 48. The article tray member 61 has substantially a U-shape as viewed in plan view as shown in FIG. 10 and an L-Shape in side elevation as viewed in FIG. 6. A bent portion 61*a* is fixed to a surface, opposite to the cut recess 55, of side surfaces of the link mount portion 48.

A rack portion 62 is fixed to the lower end of the rod 43, and a rack 62*a* is formed on one side of the rack portion 62 having a rectangular cross section.

A rack portion 63 is fixed to the lower end of the rod 44, and a rack 63*a* is formed on one side, opposite to the rack 62*a*, of the rack portion 62 having a rectangular cross section.

The rack portions 62 and 63 are larger than the diameter of the rods 43 and 44 in outer dimension in horizontal cross section. The upper end faces thereof are brought into contact with the lower surface of the bearing holder 37 to thereby serve as a stopper for preventing the rods 43 and 44 from moving upwardly.

A motor 64 causes the rods 43 and 44 to move up and down. A support plate 65 of the motor 64 is mounted on the lower end face of the bearing holer 37. An output shaft 64*a* of the motor 64 is arranged in the horizontal direction with its distal end portion being fixedly provided with a pinion gear 66 which is engaged with the racks 62*a* and 63*a*.

Guide members 67, 67 are mounted on lower end portions of the support plate 65 for stably guiding the rack portions 62 and 63 for moving up and down.

A motor 68 causes the bearing holder 37 to rotate about its own center axis (see FIG. 7). A support plate 69 therefor is mounted on the lower surface of the base 35. An output shaft 68*a* of the motor 68 is arranged vertically with its distal end portion being fixedly provided with a pulley 70. A belt 71 is laid between the pulley 70 and the lower end portion of the bearing holder 37.

Thus, in the article transporting system 1A, when the pinion gear 66 is rotated by the motor 64, since the rack portions 62 and 63 are moved in the opposite directions to each other through the same distance, the angle defined between the links 46 and 50 is changed by the vertical movement of the rods 43 and 44. As a result, the link mount portion 48 and the article tray member 61 which constitute the article transporting unit are moved in the horizontal direction. In this case, the straight line that passes through the respective center of the pins 59 and 60 is always kept in parallel with the moving direction of the rods 43 and 44 by the parallel link mechanism which is constituted by the links 50 and 51. Thus, the article transporting unit is moved in the horizontal direction while keeping its posture constant.

When the pulley 70 is rotated by the motor 68, since the bearing holder 37 is rotated through the belt 71, the part, as a whole, supported by the bearing holder 37 is rotated.

Figure 11:
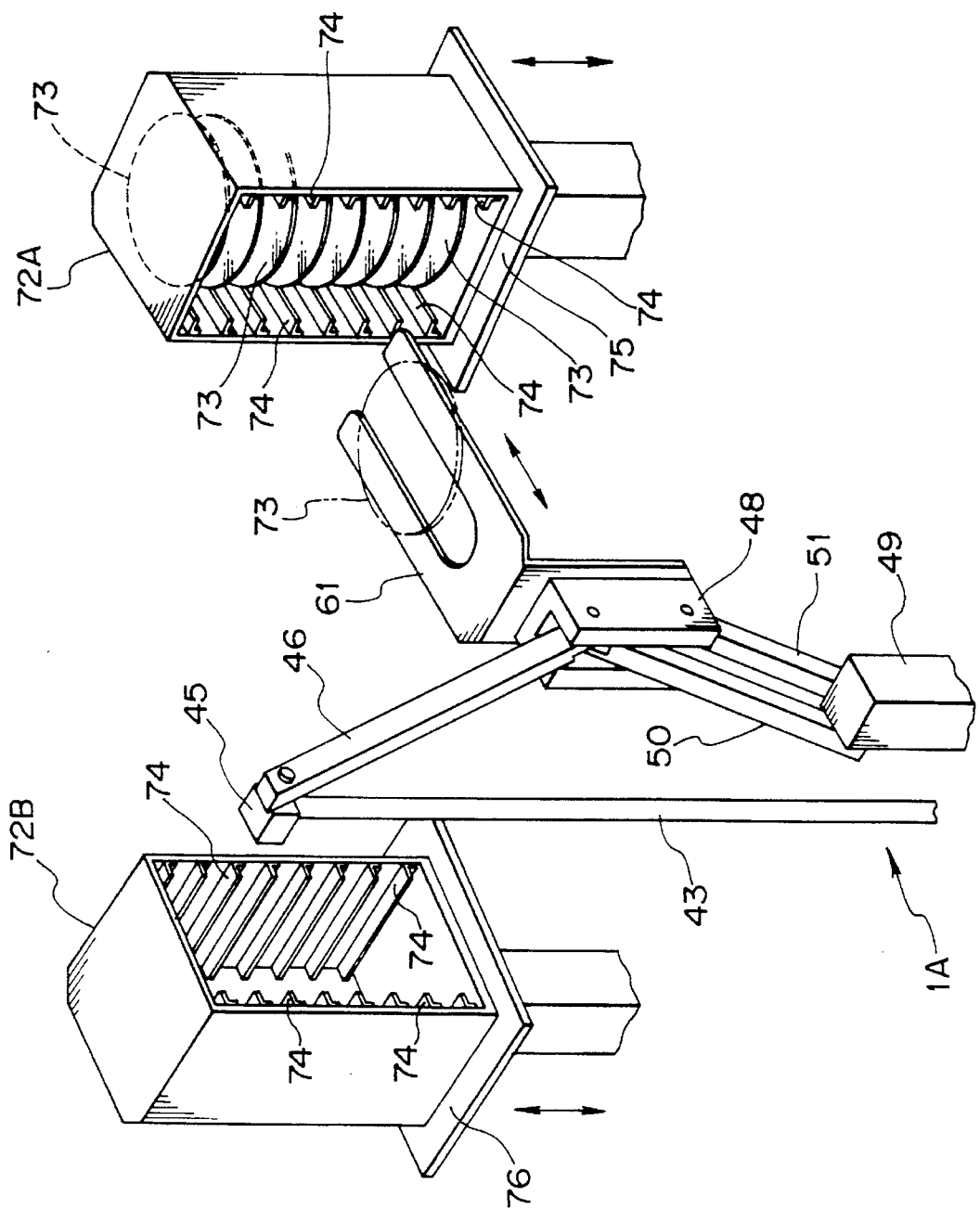
FIG. 11 is a perspective view showing a state of the disc transporting work.

FIGS. 10 and 11 shows a working example for moving a disk which is a work to be handled, from one place to another by the article transporting system 1A.

In plan view as shown in FIG. 10, a work box 72A and a work box 72B are arranged at an angular interval of 90° relative to the article transporting system 1A, assuming that the work box 72A be a box to be transported from the start point and the work box 72B be a box on the destination.

As shown in FIG. 11, the work boxes 72A and 72B are structured so as to receive a number of discs 73, 73, . . . in their interior in the vertical direction. The discs 73, 73, . . . may be supported at edge portions by support members 74, 74, . . . In addition, the work boxes 72A and 72B are moved vertically by respective work elevators 75 and 76.

As indicated by the solid lines in FIG. 10, in the case where the article transporting unit of the article transporting system 1A is kept in the stand-by position facing the opening of the work box 72A, when the rod 43 is moved downwardly the rod 44 is moved upwardly by the rotation of the motor 64, the angle defined between the links 46 and 50 is decreased, the article tray member 61 is projected from the work box 72A and its distal end is located within the work box 72A.

Although the disc 73 to be transported is supported by the support members 74, it is laid on the article tray member 61 by the descending motion of the work elevator 75.

Thereafter, when the operation which is exactly reversed to that which has been performed is carried out and the article transporting unit is located in the original position, the components, as a whole, on the bearing holder 37 are rotated by the rotation of the motor 68, and the article transporting unit is located in the stand-by position opposite to the opening of the work box 72B as indicated by the two-dot and dash lines in FIG. 10. Then, when the rod 43 is moved downwardly and the rod 44 is moved upwardly by the rotation of the motor 64, the angle defined between the links 46 and 50 is decreased, and the article tray member 61 which carries thereon the disc 73 is projected toward the work box 72B with its distal end being within the work box 72B.

The disc 73 which is carried on the article tray member 61 is received on the support members 74 within the work box 72B by the elevation of the work elevator 76.

Thereafter, the operation which is exactly reversed to that which has been performed is carried out and the article transporting unit comes to the original stand-by position. All the components on the bearing holder 37 are rotated by the rotation of the motor 68, and the article transporting unit is returned back to the stand-by position in front of the work box 72A to thereby complete one cycle of the disc transporting work.

As shown in plan view in FIG. 10, the protruding parts which appear due to the bending motions of the links 46, 50 and 51 do not interfere with the peripheral equipment at al. The dead space as viewed from the side is limited to the sliding direction of the rods 43 and 44. Also, since the angle defined between the links 46 and 50 is increased and both links 46 and 50 are widely opened, the dead space is small.

Figure 12:
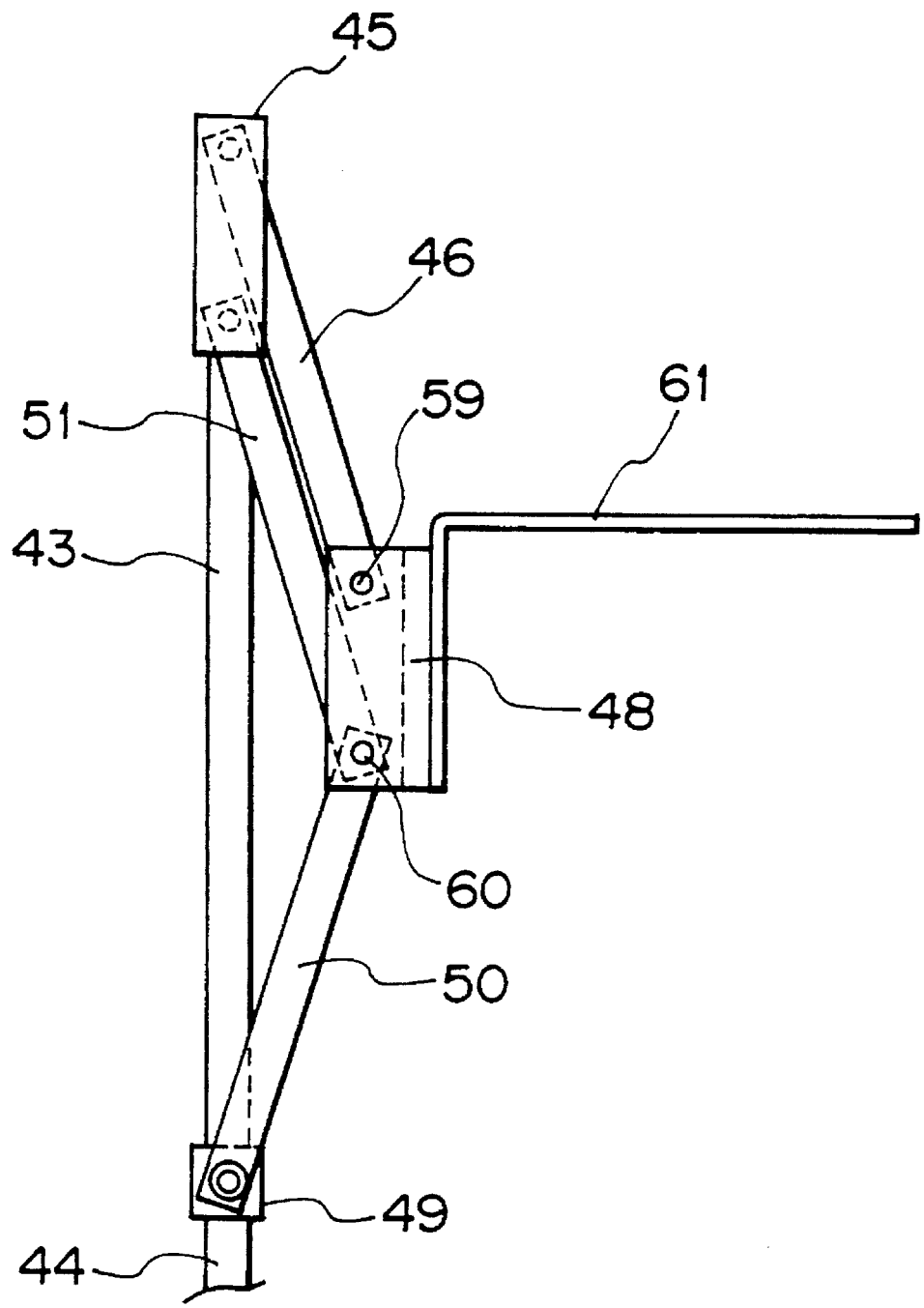
FIG. 12 is a side elevational view showing a primary part of an example in which a link is juxtaposed relative to the first link.

Incidentally, in the article transporting system 1A, the two links 50 and 51 are provided between the link mount portion 49 of the rod 44 and the link mount portion 48 of the article transporting unit to form the parallel link mechanism. It is however possible to juxtapose two links 46 and 51 between the link mount portion 45 of the rod 43 and the link mount portion 48 of the article transporting unit as shown in FIG. 12.

Figure 13:
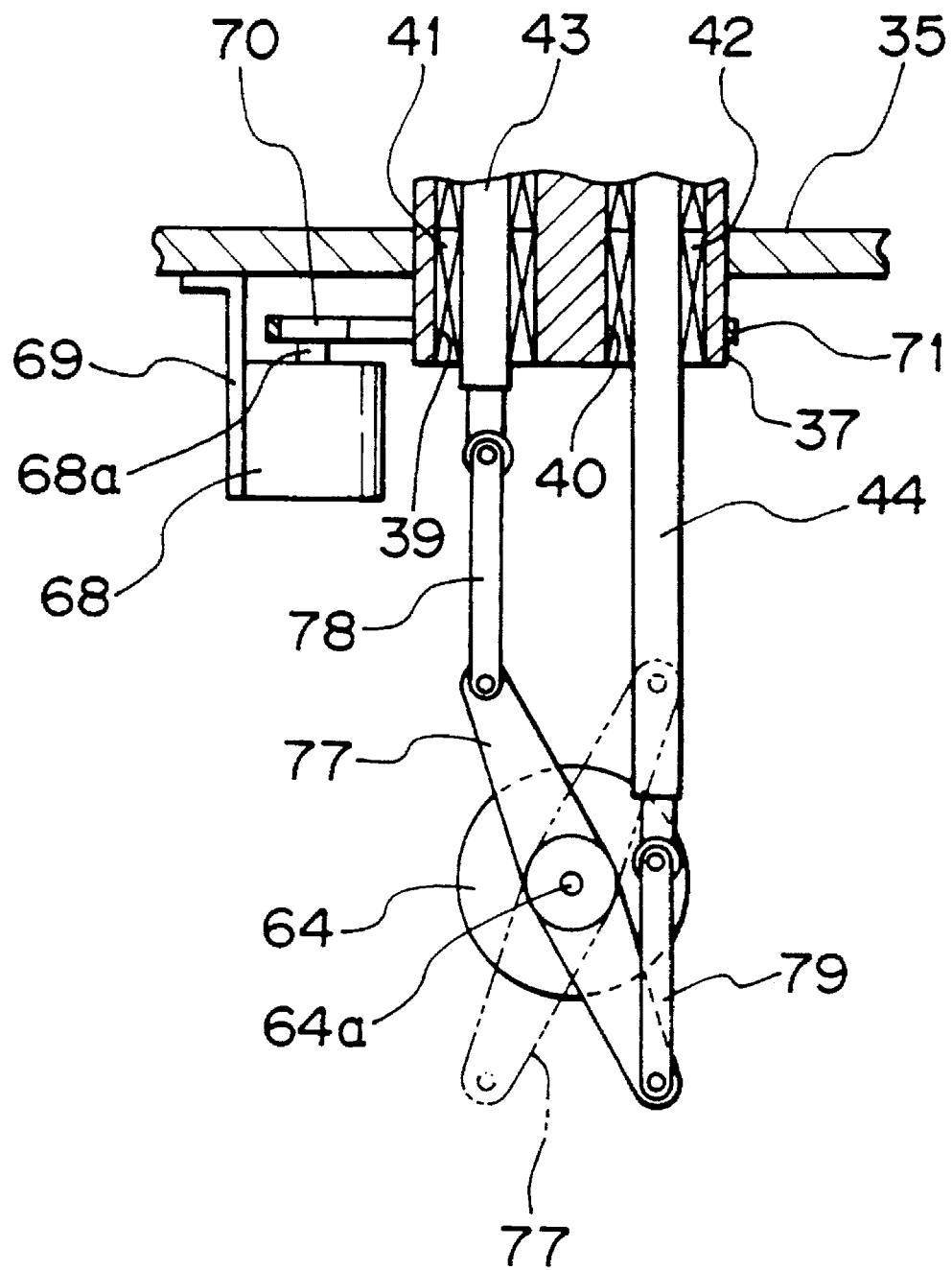
FIG. 13 is a side elevational view showing a primary part of an example in which a rotary lever and connecting rods are used as a linear drive mechanism.

Instead of using the pinion gear 66 fixed to the output shaft 64a of the motor 64 and the racks of the rods 43 and 44 as the mechanism for moving the rods 43 and 44 in the vertical direction, it is possible to use a mechanism in which a rotary lever and connecting rods as shown in FIG. 13.

More specifically, if the rotary lever 77 is fixed to the output shaft 64a of the motor 64, at the same time, first end portions of the connecting rods 78 and 79 are rotatably connected to both end portions of the rotary lever 77, respectively, and the other end portions of the connecting rods 78 and 79 are rotatably coupled with the lower end portions of the rods 43 and 44, respectively, it is possible to vertically move the rods 43 and 44 in the opposite directions to each other through the same shift when the rotary lever 77 is rotated. According to this mechanism, since it is possible to increase the amount of movement of the rods 43 and 44 relative to the angular motion of the rotary lever 77, the operational speed may be increased, and it is also possible to avoid a problem of friction caused by the engagement of the gears such as the rack and pinion engagement.

Figure 14:
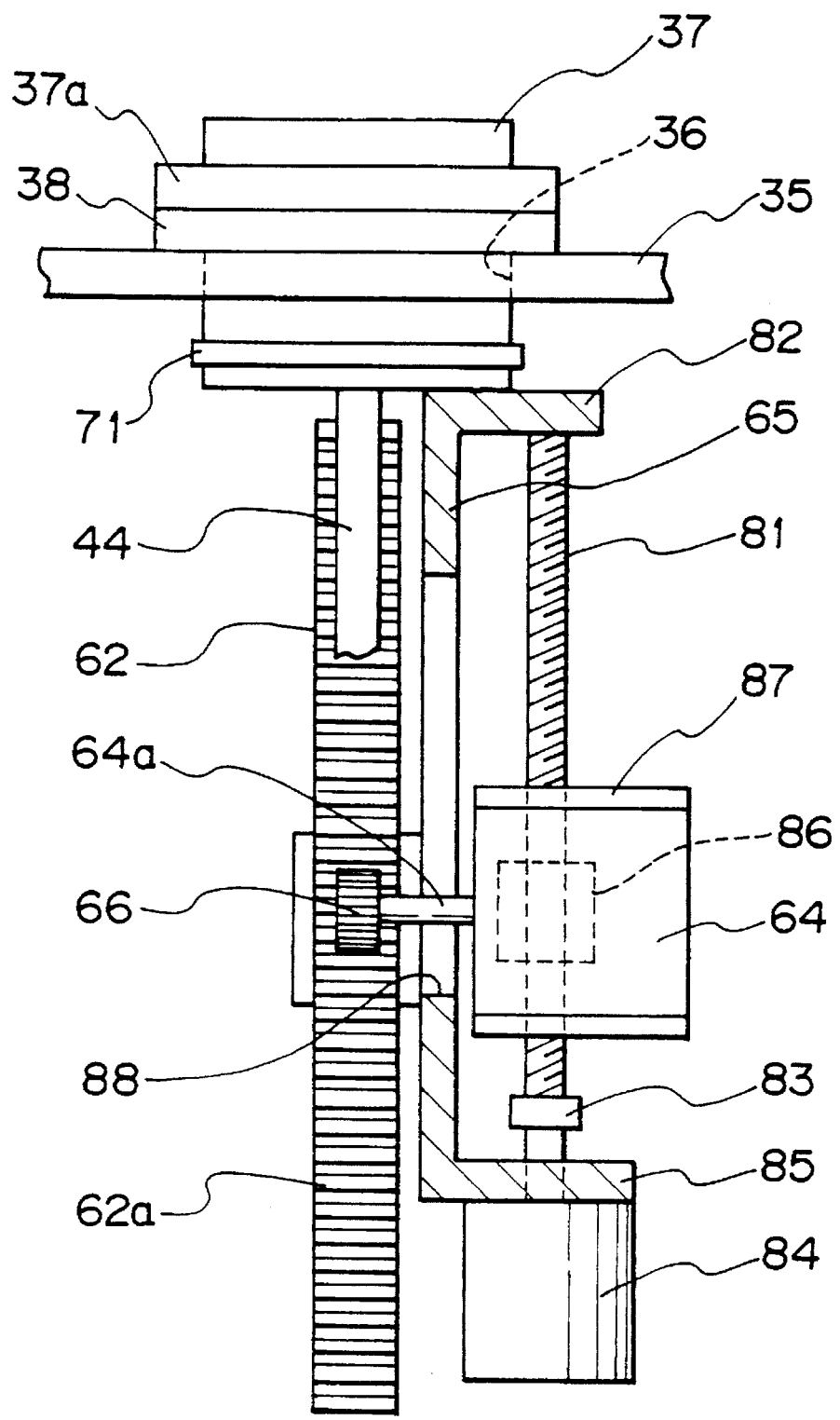
FIG. 14 is a side elevational view showing a primary part of an example of a structure of the moving means relative to the linear drive mechanism, together with FIG. 15.
Figure 15:
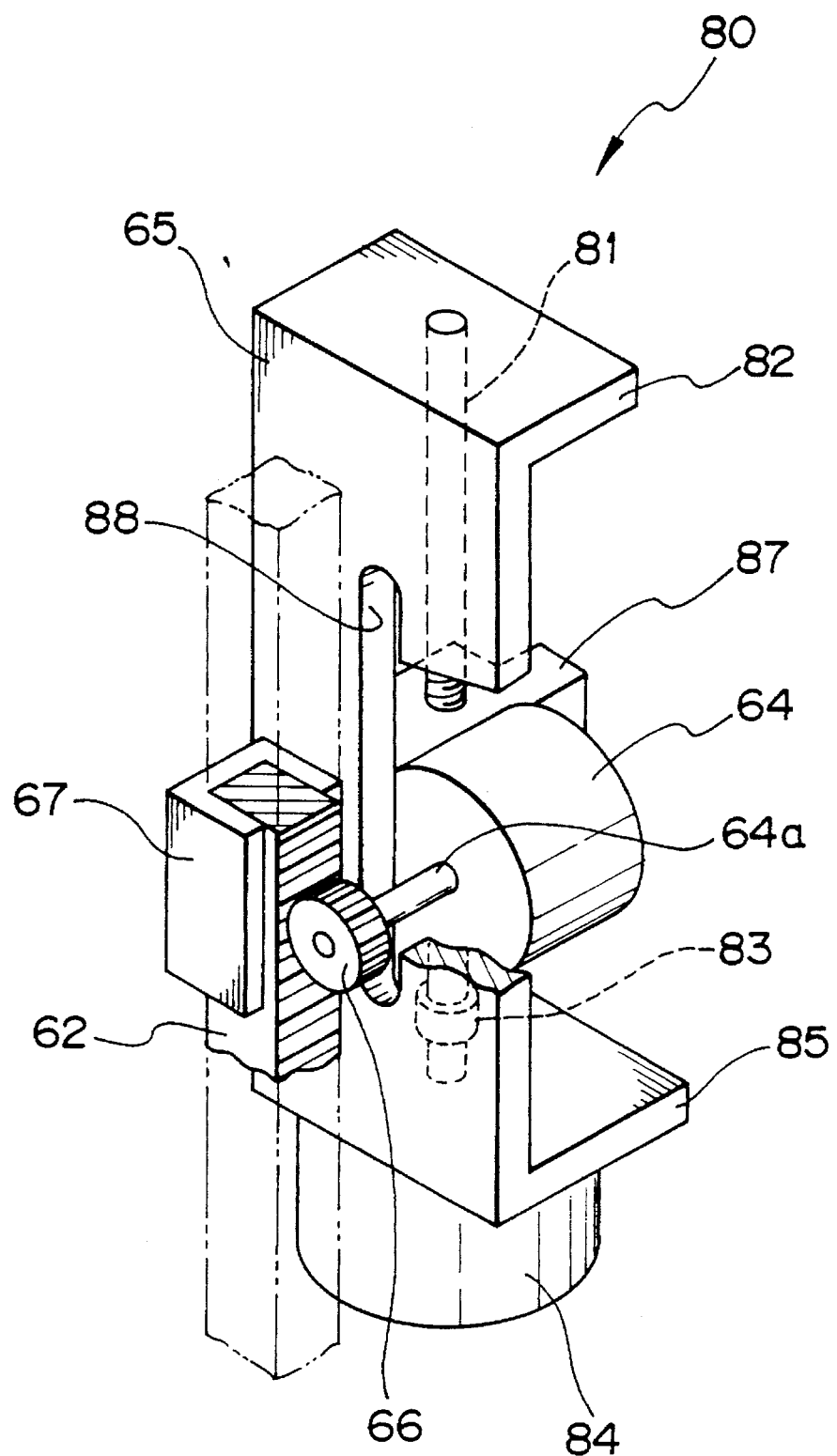
FIG. 15 is a partially fragmentary, perspective view showing the primary part.

In the previous example, since there is no mechanism for moving vertically the article transporting unit, it is necessary to use the work elevators 75 and 76 for moving vertically the work boxes 72A and 72B. As shown in FIGS. 14 and 15, it is possible to provide a mechanism 80 for vertically moving the rods 43, and 44, pinion gear 66 and motor 64, as a whole.

More specifically, a ball screw 81 is arranged vertically to the support plate 65 with one end thereof being supported to a bearing portion 82 provided at the upper end of the support plate 65 and the other end being coupled to the output shaft of a motor 84 through a coupling member 83. The motor 84 is mounted on a support portion 85 at the lower end of the support plate 65. When the ball screw 81 is rotated by the motor 84, a ball nut 86 and a mount base 87 for the motor 64 fixedly provided with the ball nut 86 are moved in the vertical direction. A long hole 88 is formed in the vertical direction in the support plate 65. The output shaft 64a of the motor 64 is fixedly provided with the pinion gear 66 through the long hole 88. Accordingly, the ball nut 86 and the mount base 87 are moved vertically by the rotation of the motor 84, the pinion gear 66 and the rack portions 62 and 63 engaged with the pinion gear 66 are moved vertically together, so that the rods 43 and 44 are moved vertically to thereby control a level height of the article transporting unit.

Figure 16:
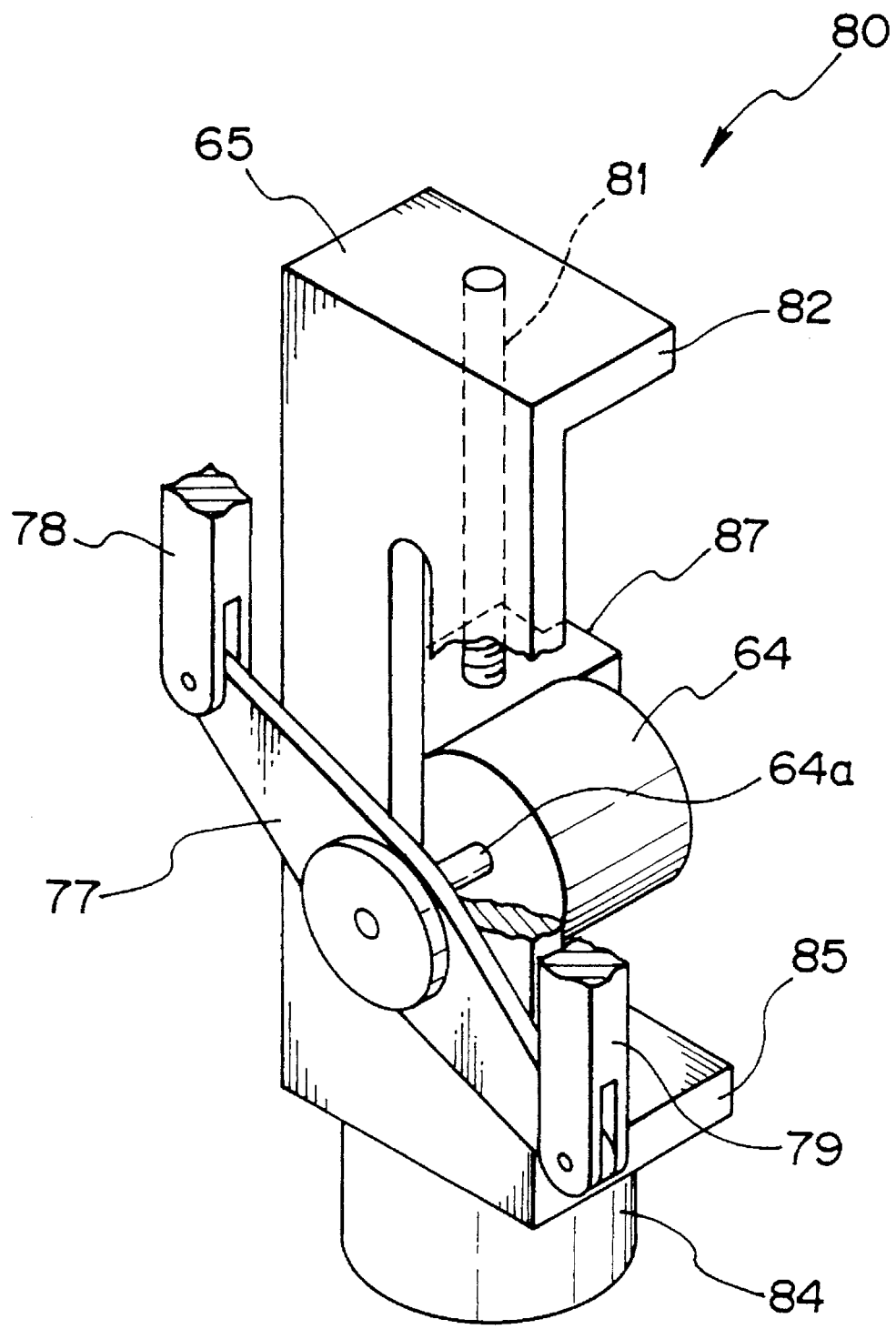
FIG. 16 is a partially fragmentary, perspective view showing a primary part of an example in which the moving means shown in FIGS. 14 and 15 is applied to the linear drive mechanism which uses the rotary lever and connecting rods.

The mechanism 80 may be of course applied to a moving means relative to the linear drive mechanism using the rotary lever 77 and the connecting rods 78 and 79. Namely, as shown in FIG. 16, if the output shaft 64a of the motor 64 is fixed to the rotary lever 77 through the long hole 88, the ball nut 86 and the mount base 87 are moved up and down by the rotation of the motor 84, so that the motor 64, rotary lever 77, connecting rods 78 and 79, and rods 43 and 44 are all moved together up and down.

Figure 17:
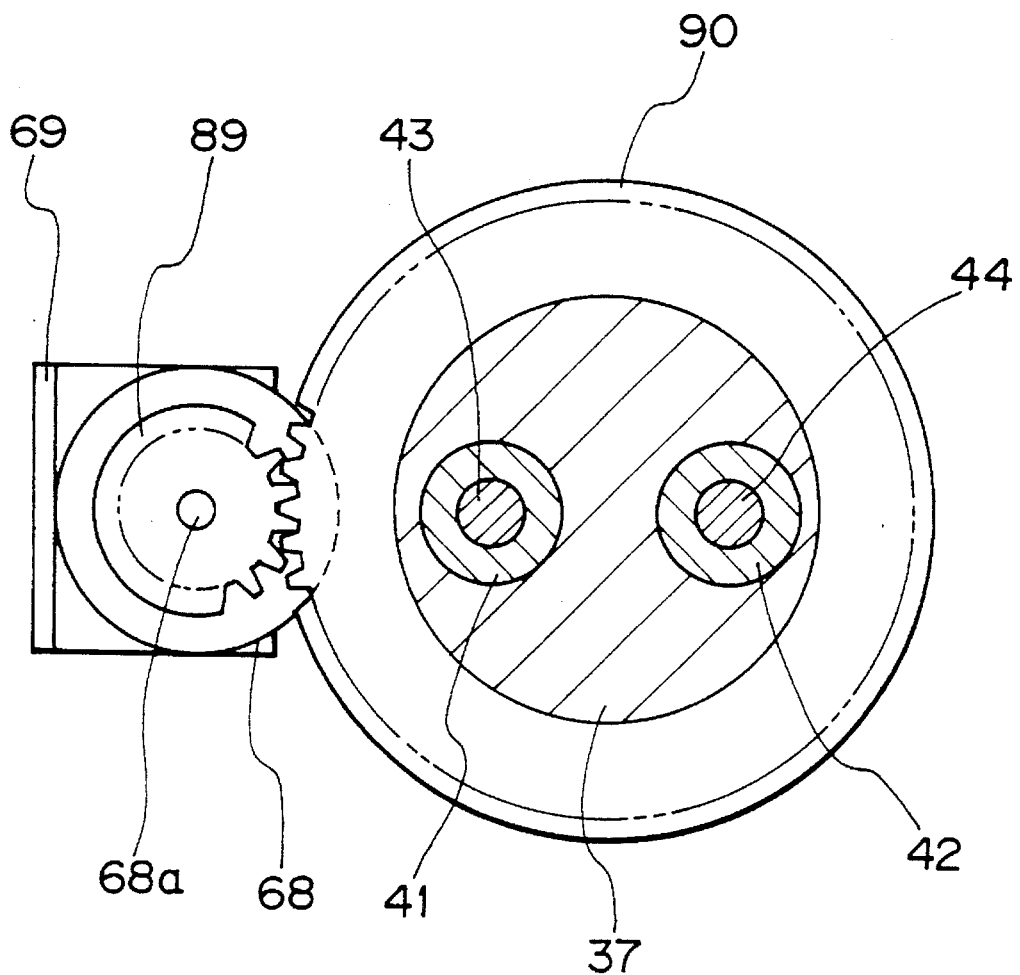
FIG. 17 is an enlarged cross-sectional view showing a modification of the rotary drive mechanism.
Figure 18A:
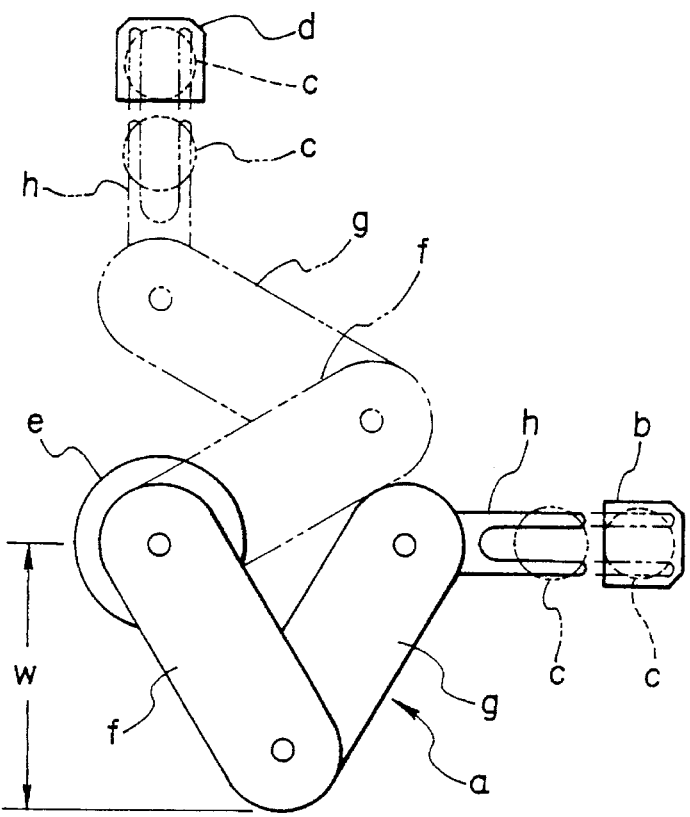
FIG. 18A is a plan view showing a conventional example using a scalar type robot.
Figure 18B:
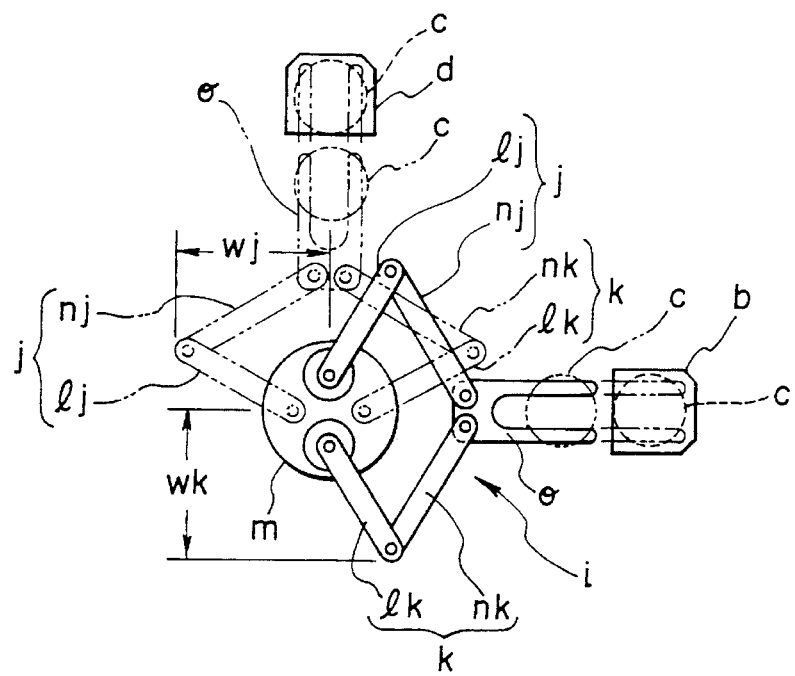
FIG. 18B is a plan view showing another conventional example using a frog leg type handler.

In the foregoing embodiments, the belt 71 is used for transmitting the drive torque of the motor 68 to the bearing holder 37. However, as shown in FIG. 17, it is possible to use a mechanism in which a gear 89 fixed to the output shaft 68a of the motor 68 is engaged with a gear 90 fixed to a lower end portion of the bearing holder 37. Also, it is possible to use electric power motors or pneumatic drives as the motors 68, 64 and 84, and it is possible to use a clamper using a vacuum suction in the article transporting unit.

As has been described above, in the article transporting system according to the present invention, it is possible to change the angle defined between the first and second links and to move the article transporting unit in the direction perpendicular to the moving direction of the linear moving arms by linearly moving the two linear moving arms in the opposite directions. Accordingly, in moving the article, the angle defined by the first and second links which are arranged to open is increased to thereby minimize the extrusion amount of the collapsing motion of both links. Thus, it is possible to save the dead space and to make the system compact.

As the posture maintaining means interposed between the first or second linear moving arm and the article transporting unit for maintaining a stable posture of the article transporting unit in the moving operation, it is possible to keep the stable posture of the article transporting unit during the transportation with a relatively simple structure by using a mechanism including the pair of timing pulleys fixed, respectively, to the rotary shaft of the linear moving arm and the article transporting unit and the timing belt laid between the timing pulleys, a mechanism in which gear portions are provided at end portions of the first and second links on the article transporting unit side and the gear portions are engaged with each other, or a mechanism in which first end portions of the first and second links are mounted on the article transporting unit by a single rotary shaft and a third link is provided in parallel to the first of second link.

By using the rack and pinion mechanism as the linear moving drive means relative to the first and second linear moving arms, or a mechanism using the rotary lever and the connecting rods, it is also possible to make the system simple and compact in comparison with the mechanism in which the first linear moving arm and the second linear moving arm are driven respectively. Furthermore, by providing means for moving the first and second linear moving arms and the linear drive means as a whole, it is possible to transport the articles without using the moving means (i.e., work elevators) for the work boxes.

Various details of the invention may be changed without departing from its spirit nor its scope. Furthermore, the foregoing description of the embodiments according to the present invention is provided for the purpose of illustration only, and not for the purpose of limiting the invention as defined by the appended claims and their equivalents,

What is claims is:

1. A transporting apparatus comprising:
    a first linear moving arm and a second linear moving arm which are juxtaposed so as to move linearly with center axes of said first and second linear moving arms remaining in a substantially parallel relationship with each other;
    an article transporting unit for moving an article;
    a first link pivotally mounted at one end on a first end portion of said first linear moving arm and at the other end on said article transporting unit;
    a second link pivotally mounted at one end on a first end portion of said second linear moving means and at the other end with said article transporting unit;
    a linear drive means for moving said first and second linear moving arms synchronously with each other and opposite to each other so as to move said article transporting unit in a direction perpendicular to center axes of said first and second linear moving arms through a link mechanism composed of the first and second links;

a posture maintaining means interposed between said first and second linear moving arms for preventing a change in posture of said article transporting unit during the movement of said article transporting unit; and a rotary drive means for rotating a mechanism which includes said first and second linear moving arms and said linear drive means, about an axis that is parallel with said first and second linear moving arms.

2. The apparatus according to claim 1, wherein said linear drive means includes a drive mechanism composed of rack portions separately provided to the first and second linear moving arms and a pinion gear that is rotated by a rotary means while engaging with said rack portions.

3. The apparatus according to claim 2, further comprising a moving means for moving both of said linear moving arms in the same direction by moving a drive mechanism, including a pinion gear, in a direction of the center axes of said first and second linear moving arms.

4. The apparatus according to claim 1, wherein said linear drive means includes a rotary lever rotated by a drive means, and connecting rods for connecting the first linear moving arm and said second linear moving arm with end portions of said rotary lever, respectively.

5. The apparatus according to claim 4, further comprising a moving means for moving both of said linear moving arms in the same direction by moving a rotary center of said rotary lever in a direction of the center axes of said first and second linear moving arms.

6. The apparatus according to claim 1, wherein said posture maintaining means includes a first timing pulley fixed to a pivot shaft of said first linear moving arm for pivotally supporting the first end portion of said first link, a second timing pulley fixed to said article transporting unit about a pivot shaft of the other end portion of said first link and a timing belt laid between said first pulley and said second pulley.

7. The apparatus according to claim 1, wherein said posture maintaining means includes a first gear portion provided at the end portion of said first link on a side of said article transporting unit, and a second gear portion provided at the end portion of said second link on the side of said article transporting unit and engaged with said first gear portion.

8. The apparatus according to claim 1, wherein the end portion of said first link and the end portion of said second link are rotatably mounted on said article transporting unit by a single shaft, and said posture maintaining means includes a third link juxtaposed relative to one of said first and second links so that a parallel link mechanism is formed by said third link and one of said first and second links.

9. An article transporting apparatus comprising:

a first linear moving arm and a second linear moving arm which are juxtaposed so as to move linearly with center axes of said first and second linear moving arms remaining in a substantially parallel relationship with each other;

an article transporting unit for moving an article;

a first link pivotally mounted at one end on a first end portion of said first linear moving arm and at the other end on said article transporting unit;

a second link pivotally mounted at one end on a first end portion of said second linear moving means and at the other end with said article transporting unit;

a linear drive means for moving said first and second linear moving arms synchronously with each other and opposite to each other so as to move said article transporting unit in a direction perpendicular to center axes of said first and second linear moving arms through a link mechanism composed of the first and second links; and a posture maintaining means interposed between said first and second linear moving arms for preventing a change in posture of said article transporting unit during the movement of said article transporting unit, said posture maintaining means including a first timing pulley fixed to a pivot shaft of said first linear moving arm for pivotally supporting the first end portion of said first link, a second timing pulley fixed to said article transporting unit about a pivot shaft of the other end portion of said first link and a timing belt laid between said first pulley and said second pulley.

10. An article transporting apparatus comprising:

a first linear moving arm and a second linear moving arm which are juxtaposed so as to move linearly with center axes of said first and second linear moving arms remaining in a substantially parallel relationship with each other;

an article transporting unit for moving an article;

a first link pivotally mounted at one end on a first end portion of said first linear moving arm and at the other end on said article transporting unit;

a second link pivotally mounted at one end on a first end portion of said second linear moving means and at the other end with said article transporting unit;

a linear drive means for moving said first and second linear moving arms synchronously with each other and opposite to each other so as to move said article transporting unit in a direction perpendicular to center axes of said first and second linear moving arms through a link mechanism composed of the first and second links; and a posture maintaining means interposed between said first and second linear moving arms for preventing a change in posture of said article transporting unit during the movement of said article transporting unit, said posture maintaining means including a first gear portion provided at the end portion of said first link on a side of said article transporting unit, and a second gear portion provided at the end portion of said second link on the side of said article transporting unit and engaged with said first gear portion.

11. An article transporting apparatus comprising:

a first linear moving arm and a second linear moving arm which are juxtaposed so as to move linearly with center axes of said first and second linear moving arms remaining in a substantially parallel relationship with each other;

an article transporting unit for moving an article;

a first link pivotally mounted at one end on a first end portion of said first linear moving arm and at the other end on said article transporting unit;

a second link pivotally mounted at one end on a first end portion of said second linear moving means and at the other end with said article transporting unit;

a linear drive means for moving said first and second linear moving arms synchronously with each other and opposite to each other so as to move said article transporting unit in a direction perpendicular to center axes of said first and second linear moving arms through a link mechanism composed of the first and second links;

a posture maintaining means interposed between said first and second linear moving arms for preventing a change in posture of said article transporting unit during the movement of said article transporting unit;

wherein the end portion of said first link and the end portion of said second link are rotatably mounted on said article transporting unit by a single shaft, and wherein said posture maintaining means includes a third link juxtaposed relative to one of said first and second links so that a parallel link mechanism is formed by said third link and one of said first and second links.

* * * * *